(12) United States Patent
Shea et al.

(10) Patent No.: US 8,228,649 B2
(45) Date of Patent: Jul. 24, 2012

(54) IMPEDANCE-BASED CURRENT SENSOR

(75) Inventors: John Joseph Shea, Pittsburgh, PA (US); Jordan C. Lawrence, Rochester, PA (US); Lennart Jonsson, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 342 days.

(21) Appl. No.: 12/478,330

(22) Filed: Jun. 4, 2009

(65) Prior Publication Data

US 2010/0309591 A1    Dec. 9, 2010

(51) Int. Cl.
| | |
|---|---|
| *H02H 3/00* | (2006.01) |
| *H02H 9/08* | (2006.01) |
| *G01R 31/00* | (2006.01) |
| *G01R 31/08* | (2006.01) |
| *G01R 31/12* | (2006.01) |
| *H01H 9/50* | (2006.01) |

(52) U.S. Cl. ............... 361/42; 324/503; 324/536
(58) Field of Classification Search .............. 361/42
See application file for complete search history.

(56) References Cited

U.S. PATENT DOCUMENTS

| | | | |
|---|---|---|---|
| 2,607,825 A * | 8/1952 | Eisler | 361/313 |
| 5,896,262 A | 4/1999 | Rae | |
| 6,373,257 B1 * | 4/2002 | Macbeth et al. | 324/536 |
| 6,522,509 B1 | 2/2003 | Engel et al. | |
| 7,362,552 B2 | 4/2008 | Elms et al. | |
| 7,440,245 B2 | 10/2008 | Miller et al. | |
| 7,463,465 B2 | 12/2008 | Rivers et al. | |
| 2007/0262780 A1 | 11/2007 | Mernyk | |

* cited by examiner

*Primary Examiner* — Jared Fureman
*Assistant Examiner* — Lucy Thomas

(57) ABSTRACT

Arc fault detection method and apparatus employ an impedance-based current sensor to provide a sensing signal indicative of current through a conductor. The impedance-based current sensor diverts high frequency components of current through the conductor and converts the high frequency components into an arc fault signal.

22 Claims, 6 Drawing Sheets

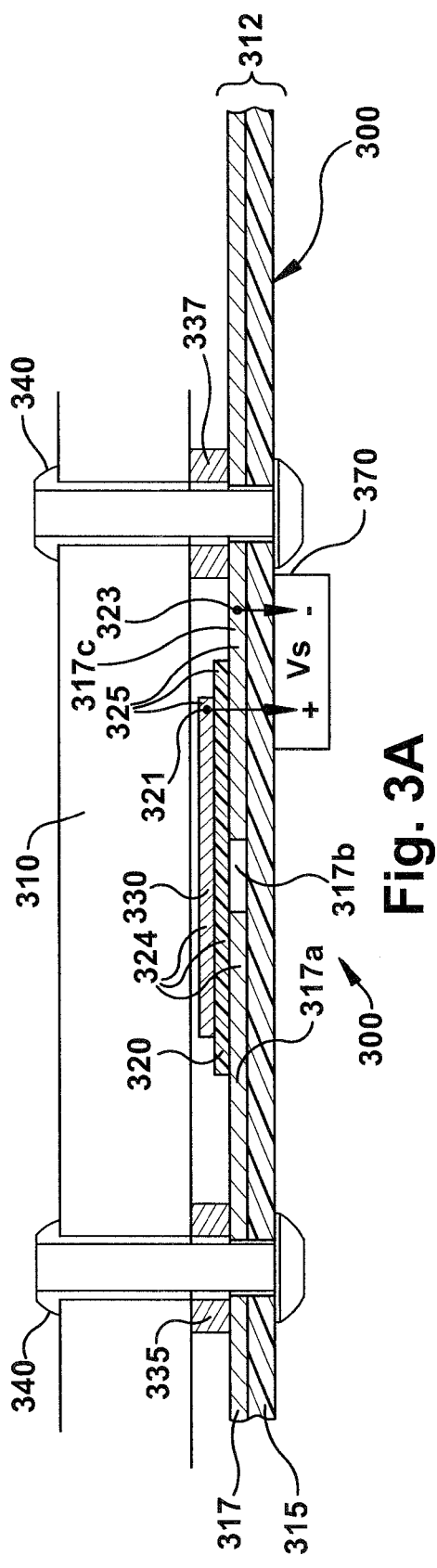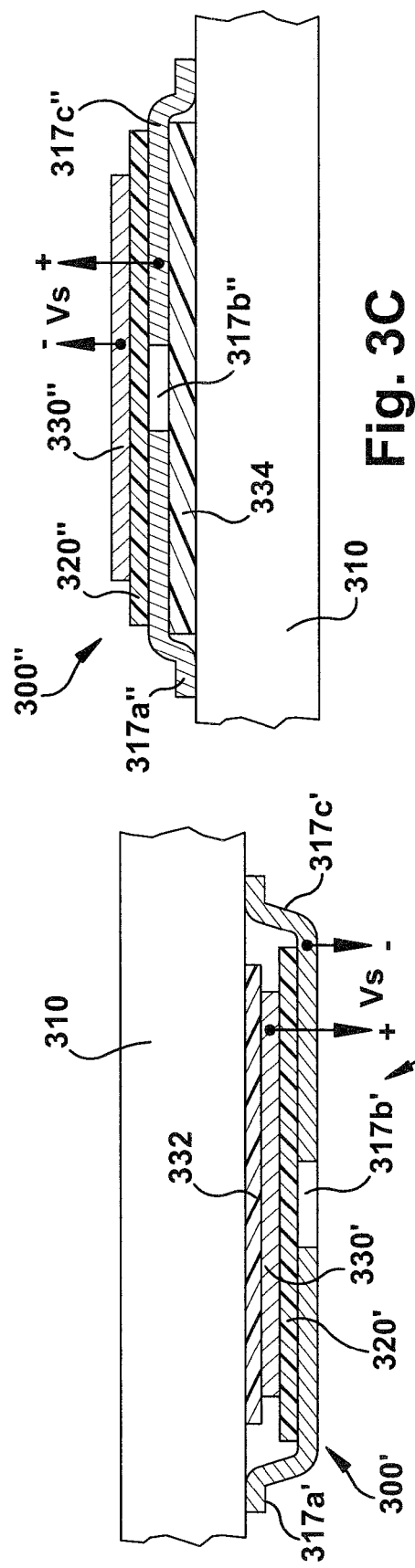

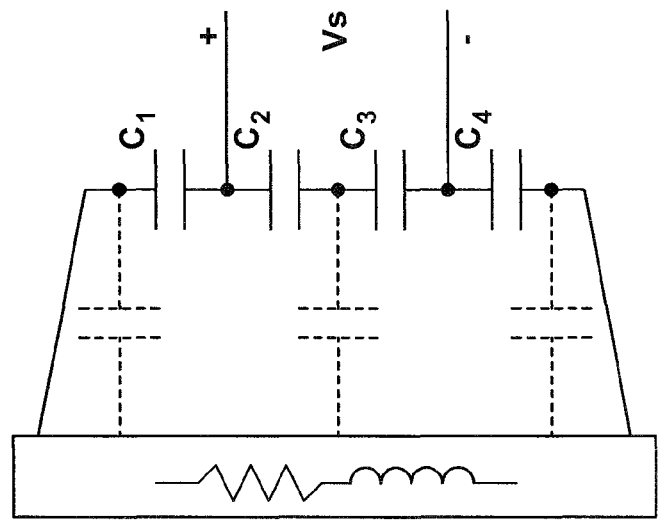
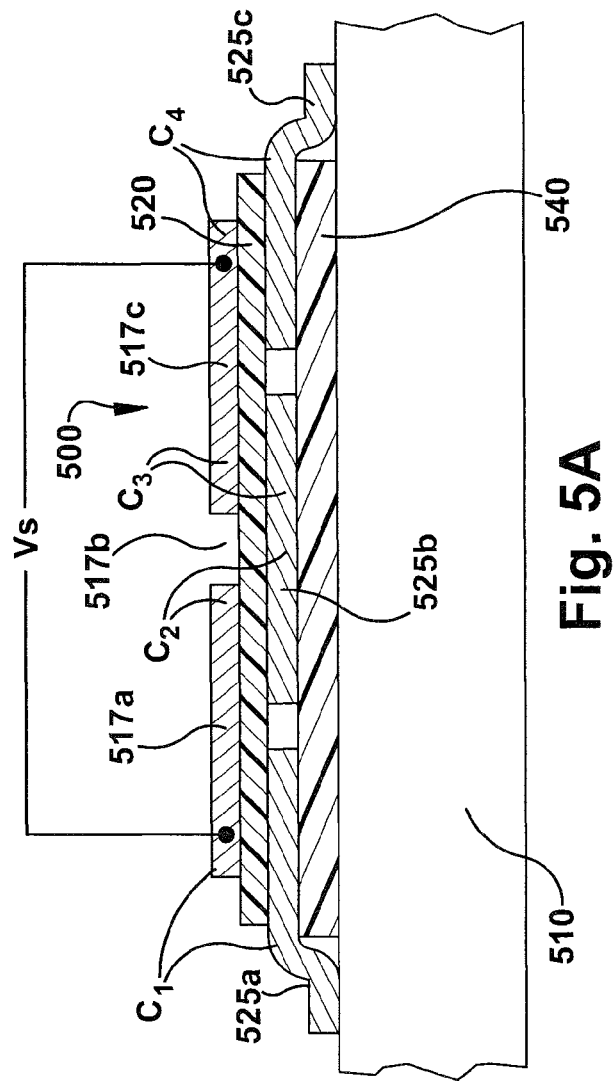
Fig. 5B
Fig. 5A

IMPEDANCE-BASED CURRENT SENSOR

BACKGROUND

Arcing can be a luminous discharge of electricity across an insulating medium, usually accompanied by the partial ionization of electrodes. An arc fault is an unintentional arcing condition in an electrical circuit. Arc faults can be caused, for instance, by worn insulation between adjacent bare connectors, by exposed ends between broken conductors, by faulty electrical connections, and in other situations where conducting elements are in close proximity. Arc faults, though often transient in nature, can cause damage to components and may start a fire if they occur near combustible material.

Detecting arc faults from broken or loose connections is difficult because arc faults do not typically generate currents of either sufficient instantaneous magnitude or sufficient average RMS current to trip a conventional thermal-magnetic circuit breaker. Hence, recent efforts in detecting arc faults have focused on developing specialized arc detecting circuits. The current signature of an arc has a broadband spectrum and is generally chaotic as compared to most loads. One technique for detecting the presence of an arc is to identify a current signature that indicates that an arc is likely occurring. A current sensor is used to provide a signal indicative of the possibility of the presence of an arc current. The signal is input to a detection circuit that analyzes the signal according to various algorithms to determine if the signal indicates the presence of arcing.

One type of current sensor used in arc fault sensing is a current transformer that is installed around the conductor that is carrying the load current. The transformer can be tuned to resonate at a target frequency range, such as, for example, 500 kHz. These transformers must be large enough to fit around the conductor, which can have a diameter of about one inch in residential settings and up to eight inches in industrial environments. In addition, the transformer must be capable of handling steady-state and fault currents without saturating the core. Often, a Rogowski air core type coil is used, which can suffer from significant variation in output response.

SUMMARY

Arc fault detection method and apparatus employ an impedance-based current sensor. The impedance-based current sensor diverts high frequency components of current through a conductor and converts the high frequency components into an arc fault signal.

As used herein, the term "conductor" includes both line conductors and neutral conductors unless otherwise specified.

In some embodiments, the impedance-based current sensor includes a plurality of impedance components electrically connected in series to one another in a shunt current path with respect to the conductor. An arc fault sensor is configured to provide the arc fault signal, which is indicative of a voltage across at least one of the serially connected impedance components, to an arc fault detection circuit.

In one embodiment, an arc fault detection apparatus includes an impedance-based current sensor. The impedance-based current sensor includes a plurality of capacitors electrically connected in series to one another; and an arc fault sensor configured to provide an arc fault signal indicative of a voltage across at least one of the serially connected capacitors to an arc fault detection circuit.

In one embodiment, the impedance-based current sensor includes a first capacitor and a second capacitor positioned after the first capacitor in the parallel current path. In this embodiment, the arc fault sensor is configured to transmit an arc fault signal indicative of a voltage across the second capacitor.

In one embodiment, the plurality of capacitors are made of alternating conducting and insulating layers on a printed circuit board. Two of the serially connected capacitors may include a first capacitor formed by a first portion of a printed circuit board laminated conducting layer, an insulating layer, and a connecting conducting layer. A second capacitor may be formed by the connecting conducting layer, the insulating layer, and a second portion of the printed circuit board laminated conducting layer. In this embodiment, the second portion of the printed circuit board laminated conducting layer is isolated electrically from the first portion. An arc fault detection circuit may also be mounted on the printed circuit board.

In other embodiments, the first capacitor may be formed by the conductor, an insulating layer, and a conducting layer. In this embodiment, the capacitance between the conductor and the conducting layer senses high frequency components of current through the conductor.

In one embodiment, an arc fault current interrupter system includes separable contacts in series with a conductor; a trip mechanism controller configured to selectively separate the separable contacts in response to a trip signal; an arc fault detection circuit in signal communication with the trip mechanism; and an impedance-based current sensor electrically connected to the conductor. The impedance-based current sensor is configured to generate and transmit the sensing signal to the arc fault detection circuit. The impedance-based current sensor transforms high frequency current components of current through the conductor into an arc fault signal. In one embodiment, the impedance-based current sensor acts as a high pass filter and the arc fault signal includes a voltage generated across at least one capacitor by current components having a frequency greater than a pass frequency of the high pass filter. In other embodiments, the arc fault signal includes a current through the at least one capacitor A method that produces an arc fault signal indicative of the presence of an arcing condition on a conductor includes creating a shunt current path with respect to the conductor, the current path including a plurality of capacitors connected in series to one another; sensing a voltage across at least one of the serially connected capacitors; and providing the arc fault signal that includes the voltage sensed across the at least one capacitor.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIGS. 3A-3C are schematic diagrams of various embodiments of an impedance-based current sensor;

FIGS. 5A and 5B are schematic diagrams of an embodiment of an impedance-based current sensor and an equivalent circuit;

DETAILED DESCRIPTION

The impedance-based current sensor described herein is suitable for use in arc fault detection systems in place of current transformers. The impedance-based current sensor provides inherent high pass filtering of the line current and is not subject to saturation or interference from magnetic fields. In some embodiments, the impedance-based current sensor can be incorporated into a printed circuit board that includes other arc fault detection system components. Because it can be fabricated in a relatively small package, the impedance-based current sensor is capable of being installed on a residential or industrial conductor more easily than typical current transformers.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Figure 1:
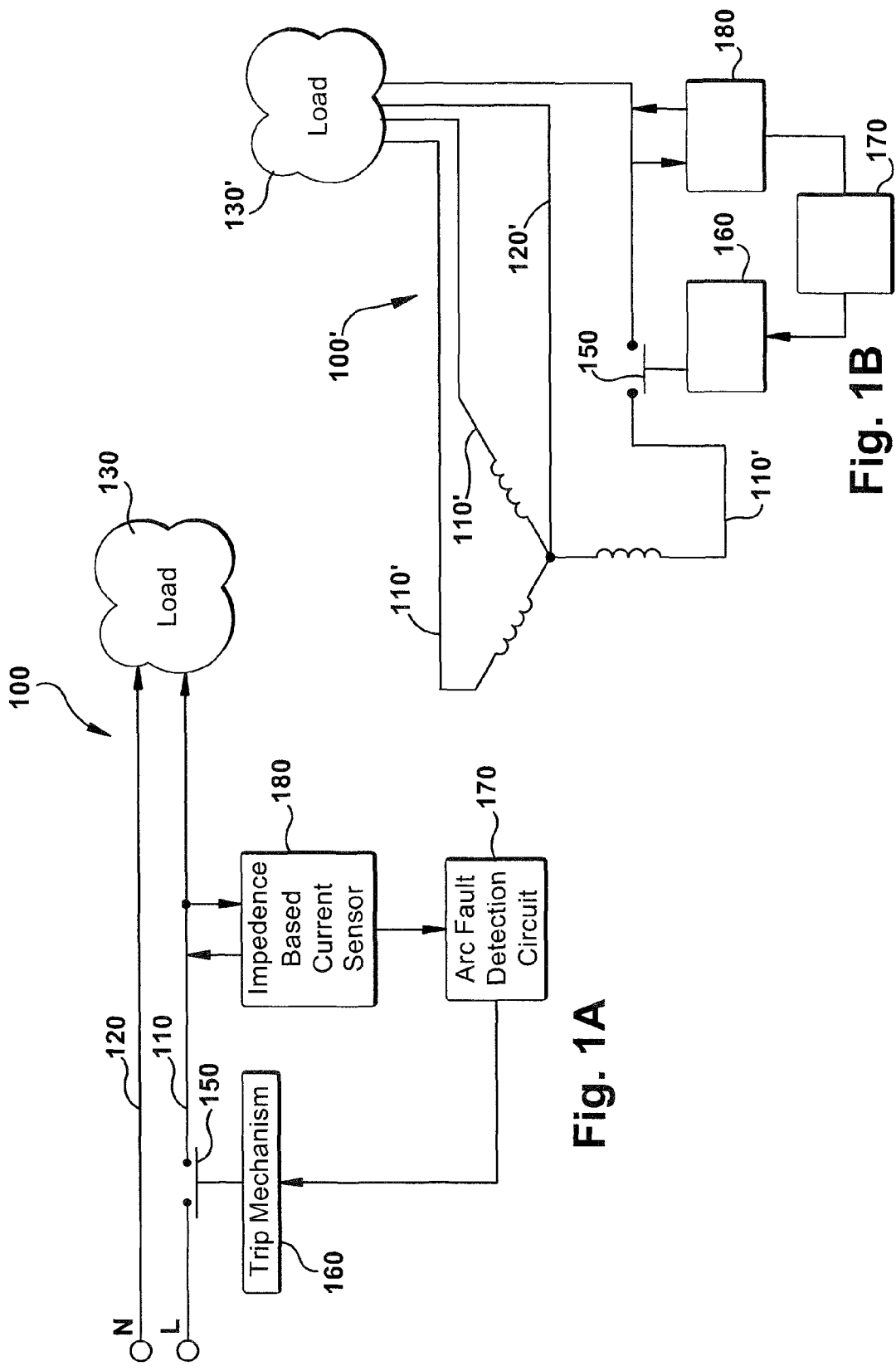
FIGS. 1A and 1B are block diagrams of various embodiments of an arc fault current interrupter system that includes an impedance-based current sensor.

FIG. 1A is a schematic diagram of one embodiment of an arc fault interrupter system 100 that includes an impedance-based current sensor 180. The arc fault interrupter system 100 is configured to be connected to an electrical system that includes a line conductor 110 and a neutral conductor 120 that provide power to a load 130. The arc fault interrupter system 100 includes a trip mechanism 160 that operates a circuit interrupter 150, such as, for example, a circuit breaker or contactor that includes separable contacts placed in the line conductor 110. The circuit interrupter 150 is configured to interrupt the flow of current through the line conductor when opened by the trip mechanism 160.

The trip mechanism 160 is controlled by an arc fault detection circuit 170 that processes various signals and determines when an arc fault is likely to be occurring on the line conductor. Many arc fault detection circuits 170 are known, which implement various algorithms to analyze current, voltage, or other parameters of a circuit to detect the presence of an arc fault in the circuit. The arc fault detection circuits are designed based on the type of input sensing signal they process and can be implemented with programmable microprocessors and/or discrete circuit components.

The impedance-based current sensor 180 senses the current on the line conductor 110. The impedance-based current sensor 180 acts as a high pass filter that filters out lower frequency components of the line conductor, such as 60 Hz line current components. The higher frequency current components above filter's cut-off frequency that are passed by the impedance-based current sensor 180 may require less amplification than lower frequency current components and may also provide a better indicator of an arc fault than lower frequency current components below the cut-off frequency of the high pass filter. In one exemplary embodiment, the impedance-based current sensor filters out current components having a frequency of less than about 500 kHz.

While the trip mechanism 160 and the impedance-based current sensor 180 are shown installed on the line conductor 110 in FIG. 1A, it will be understood that either or both of these components can be installed on the neutral conductor 120 instead of or in addition to the line conductor. FIG. 1B is a schematic diagram of one embodiment of an arc fault interrupter system 100' that includes an impedance-based current sensor 180' installed in a polyphase power system. It will be understood that any number of trip mechanisms 160' and impedance-based current sensors 180' can be installed on any number of the conductors, including the line conductors 110' or the neutral conductor 120' depending on the specific application of the arc fault interrupter system 100'.

Figure 2:
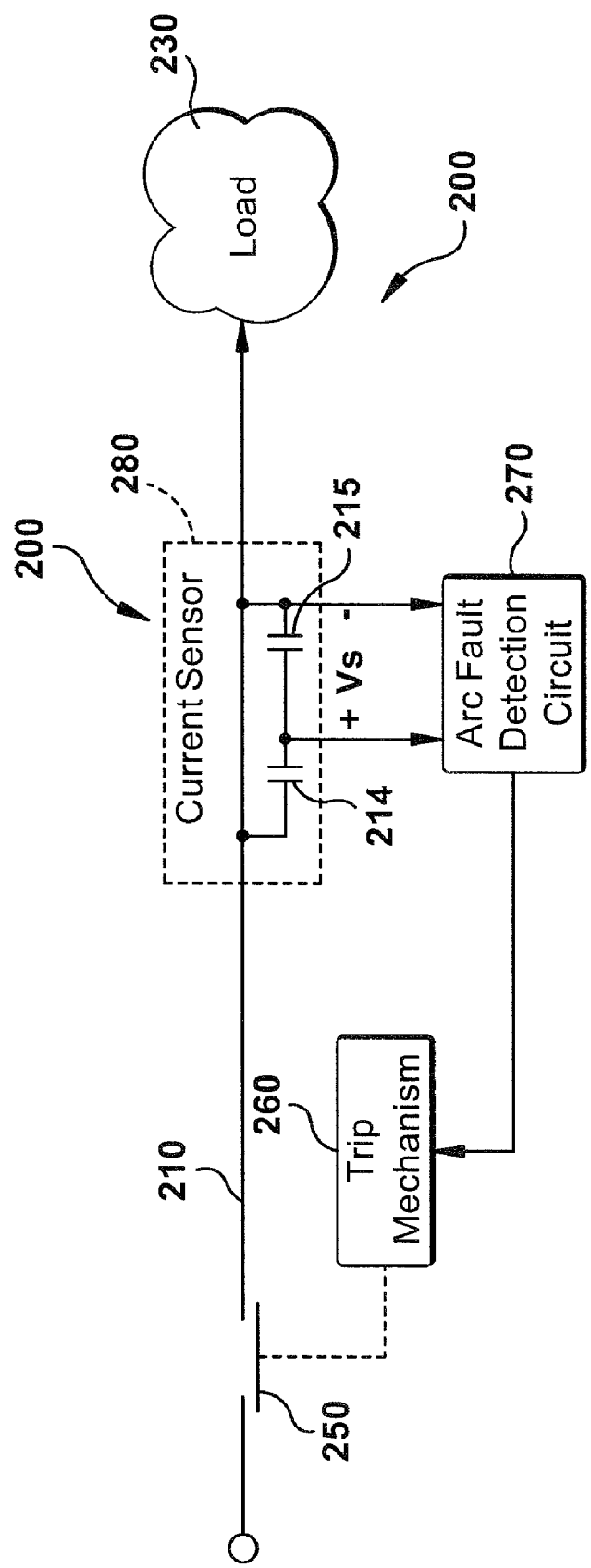
FIG. 2 is a block diagram of one embodiment of an arc fault current interrupter system that includes an impedance-based current sensor.

FIG. 2 is a schematic diagram of an arc fault interrupter system 200 that includes a particular embodiment of an impedance-based current sensor 280. The impedance-based current sensor is installed on a conductor 210, which can be either a line conductor or a neutral conductor, that provides power to a load 230. The impedance-based current sensor 280 senses high frequency components of the current through the conductor and provides an arc fault signal, which in the described embodiment is a voltage signal Vs, to an arc fault detection circuit 270. The arc fault detection circuit 270 processes the arc fault voltage signal Vs and controls a trip mechanism 260 based, at least in part, on the arc fault voltage signal Vs. The trip mechanism 260 operates a circuit interrupter 250 configured to interrupt the flow of current through the conductor when actuated by the trip mechanism 260.

The impedance-based current sensor 280 includes first and second impedance components. In the described embodiment, the impedance components are first and second capacitors 214, 215 connected in series to one another as shown in FIG. 2. Of course, other impedance components that can produce an arc fault signal from high frequency components of the conductor, such as resistors and/or inductors, can be used to implement the impedance-based current sensor. The impedance-based current sensor 280 provides a parallel shunt current path through both of the series-connected capacitors 214, 215 with respect to the conductor 210.

In the described embodiment, the first and second capacitors 214, 215, have the same capacitance. Capacitors having a capacitance of 32 pF or 64 pF are suitable for use in two particular embodiments. Of course, it will be recognized that any number of capacitors having a wide range of capacitance values can be used to implement an impedance-based current sensor. In one embodiment, the arc fault voltage signal Vs is sensed across the second capacitor 285. As will be described later in connection with an exemplary output signal trace shown in FIG. 4, during normal operating conditions the arc fault voltage signal will be negligible. A high frequency arc fault voltage signal Vs will be present when an undesired series arc occurs in the conductor. Thus, the presence of an arc fault voltage signal Vs above a threshold for a predetermined duration may be interpreted by the arc fault detection circuit 270 as indicating that an arc fault is occurring.

FIG. 3A is a schematic cross section illustrating an impedance-based current sensor 300 fabricated on a printed circuit board 312. The printed circuit board 312 may also be used to mount an arc fault detection circuit, shown schematically as block 370. While, one particular embodiment of an impedance-based current sensor is described in connection with FIG. 3A, it will be apparent to one of skill in the art that the impedance-based current sensor may be implemented in any number of ways, including implementations that do not include a printed circuit board, such as, for example, implementations with discrete impedance components. The printed circuit board 312 includes a base substrate layer 315 and a conductive layer 317, often made of copper, laminated to the substrate layer 315.

The impedance-based current sensor 300 is electrically connected to a bus bar 310 by way of mounting screws 340 installed in a standard bus bar through holes. Conductive washers or shims 335, 337 provide an electrical connection between the bus bar 310 and the conductive layer 317. In some embodiments, it is preferable that the conductive washers or shims 335, 337 contact the bus bar on a relatively large surface area across the width of the bus bar to provide a low inductance connection between the impedance-based current sensor and the bus bar.

First and second capacitors 324, 325 are fabricated on the printed circuit board 312 using first and second portions 317a, 317b of the printed circuit board conductive layer 317. First and second portions 317a, 317c are electrically isolated from one another by a gap 317b in the conductive layer. The first capacitor 324 is fabricated from the conductive layer portion 317a, an insulator 320, and a connecting conductor 330. The second capacitor 325 is fabricated from the connecting conductor 330, the insulator 320, and the second conductive layer portion 317c. In some embodiments, the connecting conductor 330 is 0.002 inch thick copper foil tape with conductive adhesive and the insulator 320 is 0.001 inch thick Kapton® tape with silicon adhesive.

During operation, high frequency components of the current through the bus bar 310 flow through the first conductive layer portion 317a. A voltage is generated across the insulator 320 to the connecting conductor 330. The arc fault voltage signal Vs is generated between the connecting conductor 330 and the second conductive layer portion 317c across the insulator 320. Sensing leads 321, 323 provide the arc fault voltage signal Vs to the arc fault detection circuit 370. These leads may be integrally fabricated in the printed circuit board.

FIGS. 3B and 3C show alternative configurations for connecting the impedance-based current sensor to the bus bar 310. In FIG. 3B, an additional insulator 332 is added between the connecting conductor 330' and the bus bar 310 and the conductive layer portions 317a" and 317c" are extended to form diversion and return connection portions, respectively, that are adhered to the bus bar 310. In FIG. 3C, the conductive layer portions 317a" and 317c" are extended beyond the insulator 320" to form diversion and return connection portions, respectively, that are adhered to the bus bar 310. An additional insulator 334 is placed between the conductive layer portions 317a" and 317c" to insulate the conductive layer portions from the bus bar. To provide a low inductance connection between the impedance-based current sensor and the bus bar 310, the conductive layer portions may be adapted to contact the bus bar across the width of the bus bar. These two alternative embodiments incur stray capacitance in different circuit locations. It is believed that the embodiment shown in FIG. 3B will provide an enhanced immunity to external influences on the output signal.

In another embodiment, a method that produces an arc fault signal indicative of high frequency current through a conductor includes creating a shunt current path with respect to the conductor. The current path includes a plurality of impedance components, such as, for example capacitors, connected in series to one another. A voltage across at least one of the serially connected impedance components is sensed and an arc fault signal voltage comprising the voltage sensed across the at least one impedance component is provided. The arc fault signal may be provided to an arc fault detection circuit that processes the arc fault signal to determine the presence of an arc fault on the conductor. Current flow through the conductor may be disrupted when the presence of an arc fault on the conductor is determined.

Figure 4:
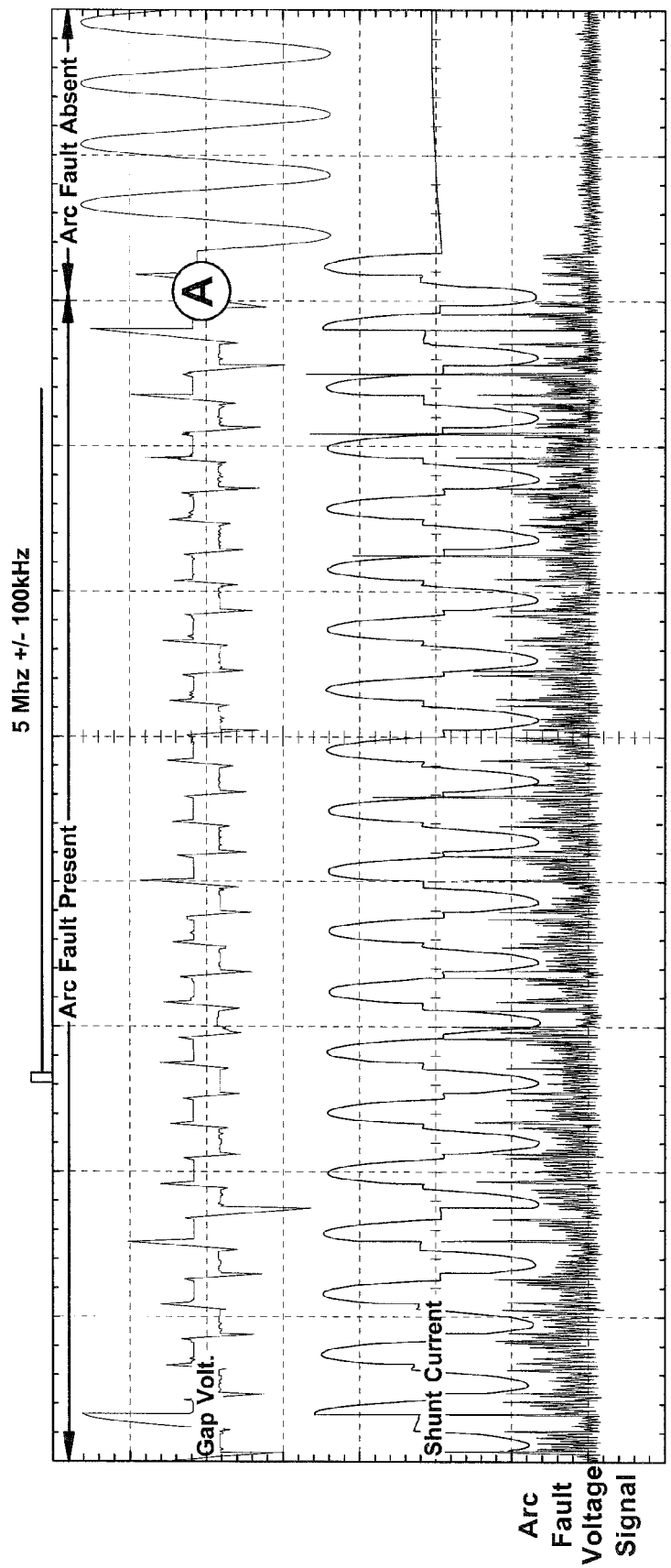
FIG. 4 is a waveform diagram depicting various electrical signals measured during practice of one embodiment of an arc fault current interrupter system.

FIG. 4 is a signal trace for signals that are provided at 5 MHz by an impedance-based current sensor. The impedance-based current sensor used to generate the traces includes conductive layer portions 317a, 317c (FIG. 3) that are 3.6 inches long by 0.73 inches wide by 0.002 inches thick. The insulator 320 (FIG. 3) is 0.001 inch Kapton® tape adhered to the conductive layer portions with silicone adhesive. The connecting conductor 330 (FIG. 3) is 0.002 inch thick copper foil tape 0.80 inches long by 0.75 inches wide adhered to the insulator with conductive adhesive. Three traces are shown in FIG. 4. The Gap Voltage (100 V/div.) is indicative of the voltage being provided to the load, the Shunt Current (5 A/div.) is the load current, and the Arc Fault Voltage Signal (100 mV/div.) is the voltage across the second capacitor of the impedance-based current sensor. FIG. 4, an arc fault is present and absent as indicated. The arc fault voltage signal can be seen as having significant amplitude at 5 MHz when the arc fault is occurring. At point "A" the arc ceases and the arc fault voltage signal falls to a negligible level.

In some example embodiments, one or more isolation capacitors are connected between the impedance-based current sensor and the arc fault detection circuit. As with capacitors in the impedance-based current sensor, the isolation capacitor may be implemented using a discrete capacitor. Alternatively, the isolation capacitor may be formed by alternating conducting and insulating layers on a printed circuit board. FIGS. 5A and 5B illustrate an impedance-based current sensor and isolation capacitors that are formed by alternating conducting and insulating layers on a printed circuit board. FIG. 5B is a schematic diagram of an impedance-based current sensor 500 installed on a bus bar 510 and formed from a conductive layer 517, an insulating layer 520, conductive layer 525, and insulating layer 540. The current sensor includes two capacitors C2 and C3 that are formed similar to the capacitors shown in FIGS. 3A-3C. The current sensor 500 also includes two isolation capacitors C1 and C4 that are formed by between conductive layer portions 525a and 517a and 517c and 525c, respectively. FIG. 5B shows an equivalent circuit of the current sensor 500 including stray capacitance in dashed lines.

While FIG. 5A shows one particular embodiment of an impedance-based current sensor that includes capacitors formed from alternating conductive and insulating layers, it will be apparent to one of skill in the art that any number of capacitors may be formed in any number of circuit connections according to the present invention.

Figure 6B:
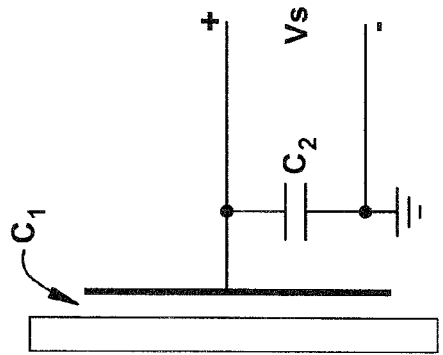
FIGS. 6A and 6B are schematic diagrams of an embodiment of an impedance-based current sensor and an equivalent circuit.
Figure 6A:
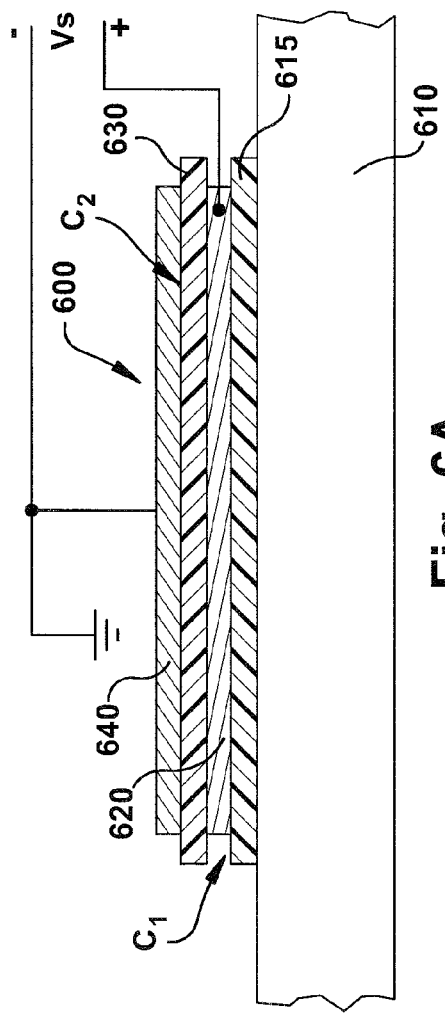

FIG. 6A illustrates an embodiment of an impedance-based current sensor 600 that is not galvanically connected to a conductor 610. Rather, a first capacitor C1 in the impedance-based current sensor 600 is formed by the conductor 610, a first insulating layer 615, and a first conductive layer 620. A second capacitor C2 is formed between the first conductive layer 620, a second insulating layer 630, and a second conductive layer 640. Either the voltage across or the current through C2 is the output of the current sensor 600. FIG. 6B is an equivalent circuit for the current sensor 600 shown in FIG. 6.

Figure 7B:
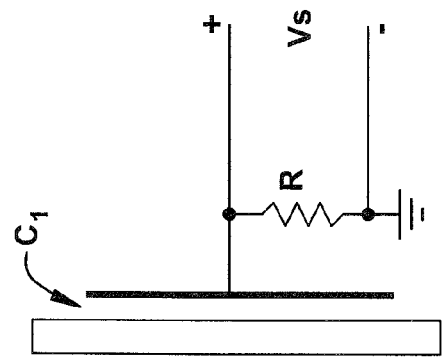
FIGS. 7A and 7B are schematic diagrams of an embodiment of an impedance-based current sensor and an equivalent circuit.
Figure 7A:
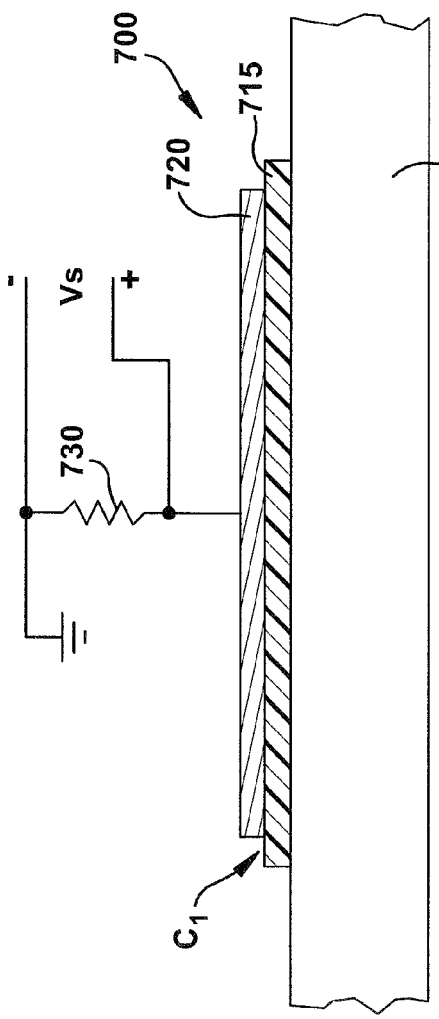

FIG. 7A illustrates an embodiment of an impedance-based current sensor 700 that is not galvanically connected to a conductor 710. Rather, a first capacitor C1 in the impedance-based current sensor 700 is formed by the conductor 710, a first insulating layer 715, and a first conductive layer 720. A resistor 730 is connected to the first conductive layer. Either the voltage across or the current through the resistor 730 is the output of the current sensor 700. FIG. 7B is an equivalent circuit for the current sensor 700 shown in FIG. 7.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

What is claimed is:

1. An arc fault detection apparatus configured to be installed on a resistive conductor, the arc fault detection apparatus comprising an impedance-based current sensor connected electrically in parallel with the resistive conductor, where the current sensor comprises an insulating layer configured to be disposed between the resistive conductor and a sensor conducting layer such that the conductor, insulating layer, and sensor conducting layer together form a capacitive element, the current sensor configured to measure high frequency components of current from the conductor and convert the high frequency current components into an arc fault signal.

2. The apparatus of claim 1 where the impedance-based current sensor is configured to provide the arc fault signal to an arc fault detection circuit.

3. The apparatus of claim 2 comprising an isolation capacitor disposed between the impedance-based current sensor and the arc fault detection circuit.

4. The apparatus of claim 1 where the impedance-based current sensor comprises:
a plurality of capacitors electrically connected in series to one another, the plurality of capacitors creating a shunt current path in parallel with the conductor; and
an arc fault sensor configured to provide an arc fault signal indicative of a voltage across at least one of the serially connected capacitors.

5. The apparatus of claim 4 where the plurality of capacitors includes a first capacitor and a second capacitor positioned after the first capacitor in the shunt current path and further where the arc fault sensor is configured to transmit an arc fault signal indicative of a voltage across the second capacitor.

6. The apparatus of claim 4 where the plurality of impedance components comprises a set of discrete capacitors connected in series to one another.

7. The apparatus of claim 6 comprising an isolation capacitor disposed between the impedance-based current sensor and an arc fault detection circuit, where the isolation capacitor comprises alternating conducting and insulating layers on a printed circuit board.

8. The apparatus of claim 4 where the plurality of capacitors comprises a plurality of capacitors comprising alternating conducting and insulating layers disposed on an insulating substrate.

9. The apparatus of claim 8 where two of the serially connected capacitors comprise a first capacitor formed by a first portion of the insulating substrate conducting layer, an insulating layer, and a connecting conductor and a second capacitor formed by the connecting conductor, the insulating layer, and a second portion of the insulating substrate conducting layer, the second portion of the insulating substrate conducting layer being isolated electrically from the first portion.

10. The apparatus of claim 9 where the insulating substrate comprises a printed circuit board.

11. The apparatus of claim 10 where at least one of the conducting layers comprises a conductive layer of the printed circuit board.

12. The apparatus of claim 1 where the current sensor is in a shunt current path such that the current diverted from the resistive conductor flows through the current sensor, and returns to the resistive conductor.

13. The apparatus of claim 1 where the impedance-based current sensor comprises a capacitor and an impedance component connected serially to the capacitor in the shunt current path and further comprising an arc fault sensor configured to transmit an arc fault signal indicative of a voltage across or a current through the impedance component.

14. The apparatus of claim 13 where the impedance component is a resistor.

15. The apparatus of claim 13 where the capacitor comprises an insulating layer disposed between the conductor and a conducting layer such that the capacitance between the conductor and the conducting layer senses high frequency components of current through the conductor.

16. An arc fault current interrupter system comprising:
separable contacts in series with a resistive conductor;
a trip mechanism controller configured to selectively separate the separable contacts in response to a trip signal;
an arc fault detection circuit in signal communication with the trip mechanism, the arc fault detection circuit configured to monitor an arc fault signal and to generate the trip signal when the arc fault signal indicates that an arc fault is occurring on the resistive conductor; and
a capacitive current sensor electrically connected in parallel with the resistive conductor, where the current sensor comprises an insulating layer configured to be disposed between the resistive conductor and a sensor conducting layer such that the conductor, insulating layer, and sensor conducting layer together form a capacitive element, the capacitive current sensor being configured to measure high frequency components of current from the conductor and convert the high frequency components into the arc fault signal.

17. The arc fault current interrupter system of claim 16 where the capacitive current sensor comprises a high pass filter and further where the arc fault signal comprises a voltage generated across at least one impedance component by current components having a frequency greater than a pass frequency of the high pass filter.

18. The arc fault current interrupter system of claim 16 where the capacitive current sensor comprises:
- a plurality of capacitive components electrically connected in series to one another, the plurality of capacitive components including at least one capacitor and creating shunt current path in parallel with the resistive conductor; and
- an arc fault sensor configured to provide the arc fault signal, the arc fault signal being indicative of a voltage across at least one of the serially connected capacitive components.

19. The arc fault current interrupter system of claim 16 where the capacitive current sensor comprises:
- a plurality of capacitive components electrically connected in series to one another, the plurality of capacitive components including at least one capacitor and creating shunt current path in parallel with the resistive conductor; and
- an arc fault sensor configured to provide the arc fault signal, the arc fault signal being indicative of a current through at least one of the serially connected impedance components.

20. A method that produces an arc fault signal indicative of an arc fault on a conductor comprising:
- creating a shunt current path with respect to the conductor, the current path including a plurality of capacitors connected in series to one another and in parallel to the conductor, such that current that flows through the plurality of capacitors returns to the conductor; where at least one of the capacitors comprises an insulating layer disposed between the conductor and a conducting layer;
- sensing a voltage across at least one of the serially connected capacitors; and
- providing the arc fault signal comprising the voltage sensed across the at least one impedance component.

21. The method of claim 20 comprising providing the arc fault signal to an arc fault detection circuit that processes the arc fault signal to determine the presence of an arc fault on the conductor.

22. The method of claim 21 comprising disrupting current flow through the conductor when the presence of an arc fault on the conductor is determined.

* * * * *